US008976338B2

(12) United States Patent
Mase et al.

(10) Patent No.: US 8,976,338 B2
(45) Date of Patent: Mar. 10, 2015

(54) RANGE SENSOR AND RANGE IMAGE SENSOR

(75) Inventors: Mitsuhito Mase, Hamamatsu (JP); Takashi Suzuki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/813,752

(22) PCT Filed: Jun. 16, 2011

(86) PCT No.: PCT/JP2011/063844
§ 371 (c)(1),
(2), (4) Date: Feb. 1, 2013

(87) PCT Pub. No.: WO2012/049884
PCT Pub. Date: Apr. 19, 2012

(65) Prior Publication Data
US 2013/0128259 A1    May 23, 2013

(30) Foreign Application Priority Data

Oct. 12, 2010 (JP) ................................. 2010-229900

(51) Int. Cl.
*G01C 3/08* (2006.01)
*G01C 3/00* (2006.01)
*G01S 17/89* (2006.01)
*G01S 7/481* (2006.01)
*G01S 7/486* (2006.01)
*H01L 27/146* (2006.01)

(52) U.S. Cl.
CPC . *G01C 3/00* (2013.01); *G01S 17/89* (2013.01); *G01S 7/4816* (2013.01); *G01S 7/4861* (2013.01); *H01L 27/14614* (2013.01)
USPC ............ 356/4.01; 356/3.01; 356/3.1; 356/4.1

(58) Field of Classification Search
CPC .......... G01C 3/08; H01L 27/14603–27/14689; G01S 7/483
USPC ............... 356/3.01–3.15, 4.1–4.1, 5.01–5.15, 356/6–22, 28, 28.5
See application file for complete search history.

(56) References Cited

U.S. PATENT DOCUMENTS

2009/0114919 A1    5/2009    Kawahito et al.
2009/0134396 A1 *  5/2009    Kawahito et al. ............... 257/72

FOREIGN PATENT DOCUMENTS

| JP | 2009-277738 | 11/2009 |
| JP | 2010-032425 | 2/2010 |
| WO | 2007/026779 | 3/2007 |
| WO | 2007/119626 | 10/2007 |
| WO | WO 2008/069141 | 6/2008 |

* cited by examiner

*Primary Examiner* — Luke Ratcliffe
(74) *Attorney, Agent, or Firm* — Drinker Biddle & Reath LLP

(57) ABSTRACT

A photogate electrode has a planar shape of a rectangular shape having first and second long sides opposed to each other and first and second short sides opposed to each other. First and second semiconductor regions are arranged opposite to each other with the photogate electrode in between in a direction in which the first and second long sides are opposed. Third semiconductor regions are arranged opposite to each other with the photogate electrode in between in a direction in which the first and second short sides are opposed. The third semiconductor regions make a potential on the sides of the first and second short sides higher than a potential in a region located between the first and second semiconductor regions in a region immediately below the photogate electrode.

2 Claims, 15 Drawing Sheets

*Fig.7*
(a)
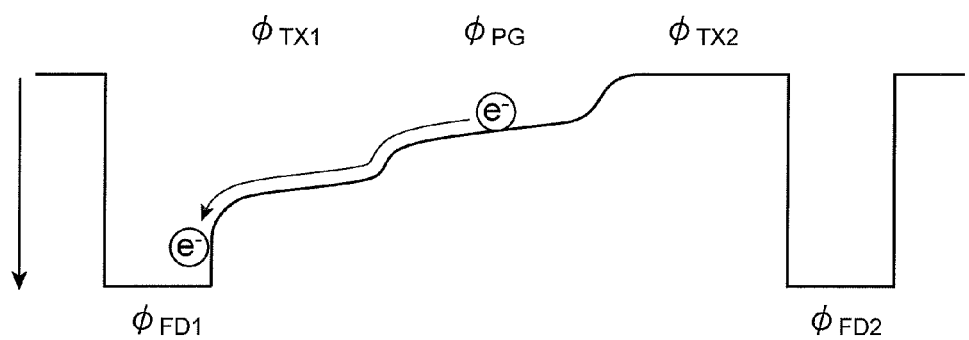
(b)
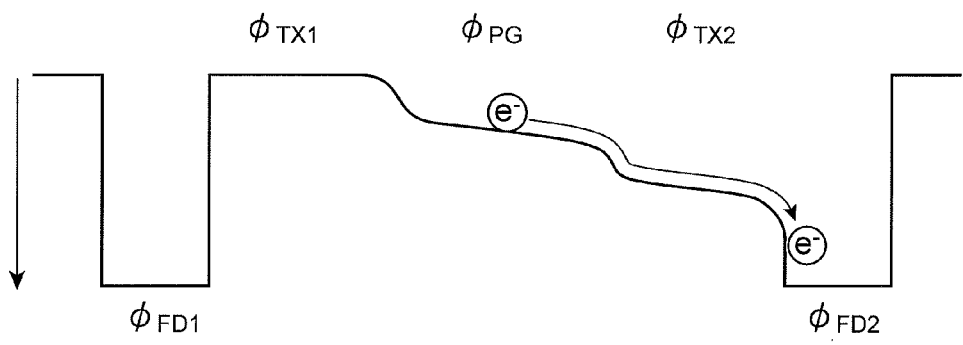

RANGE SENSOR AND RANGE IMAGE SENSOR

TECHNICAL FIELD

The present invention relates to a range sensor and a range image sensor.

BACKGROUND ART

A conventional active type optical distance measuring sensor is known as a device configured to irradiate light from a light source for projection of light such as an LED (Light Emitting Diode) toward an object, to detect reflected light from the object with a photodetecting element, and thereby to output a signal according to a distance to the object. A PSD (Position Sensitive Detector) is known as an optical distance measuring sensor of the optical triangulation type capable of readily measuring the distance to the object. Recently, there are expectations for development of an optical distance measuring sensor of an optical TOF (Time-Of-Flight) type, in order to achieve more precise distance measurement.

There are demands for an image sensor capable of simultaneously acquiring distance information and image information by a single chip, for example, in on-vehicle use, in use in automatic manufacture systems in factories, and so on. As the image sensor is installed in the front portion of a vehicle, it is expected to be used in detection and recognition of a preceding vehicle or in detection and recognition of a pedestrian or the like. There are also expectations for an image sensor capable of acquiring a range image consisting of a single piece of distance information or multiple pieces of distance information, separately from the image information. It is preferable to apply the TOF method to such a distance measuring sensor.

In the TOF method, pulsed light is emitted from the light source for projection of light toward the object and the pulsed light reflected by the object is detected by the photodetecting element to measure a time difference between the emission timing and the detection timing of the pulsed light. Since this time difference ($\Delta t$) is a time necessary for the pulsed light to travel a distance ($2 \times d$) which is twice the distance d to the object, at the speed of light ($=c$), the relation of $d=(c \times \Delta t)/2$ holds. The time difference ($\Delta t$) can be translated into a phase difference between pulses emitted from the light source and detected pulses. The distance d to the object can be determined by detecting this phase difference.

An image sensor of a charge distribution type has been attracting attention as a photodetecting element for distance measurement by the TOF method. Specifically, the image sensor of the charge distribution type is configured, for example, to distribute pulsed charges generated in the image sensor according to incidence of detected pulses, into one potential well during ON durations of emitted pulses and into the other potential well during OFF durations thereof. In this case, a ratio of charge quantities distributed right and left is proportional to the phase difference between detected pulses and emitted pulses, i.e., the time necessary for the pulsed light to travel the distance twice as long as the distance to the object at the speed of light. There are various conceivable methods of the charge distribution type.

Patent Literature 1 discloses the range sensor (range image sensor) of the TOF type which comprises a charge generating region to generate charge according to incident light, a pair of signal charge collecting regions arranged as spatially separated from each other and configured to collect the signal charge from the charge generating region, and transfer electrodes provided for the respective signal charge collecting regions and given respective charge transfer signals of different phases.

CITATION LIST

Patent Literature

Patent Literature 1: International Publication WO2007/119626

SUMMARY OF INVENTION

Technical Problem

Incidentally, a rectangular shape having a pair of long sides opposed to each other in a first direction and a pair of short sides opposed to each other in a second direction is sometimes adopted as a planar shape of the charge generating region. In this case, the signal charge collecting regions are arranged opposite to each other with the charge generating region in between in the first direction. The reasons for the adoption of the rectangular shape are, for example, to enhance the sensitivity with increase in the area of the charge generating region and to increase a transfer rate of charge in the direction in which the signal charge collecting regions are opposed.

However, it was newly found that the problem as described below could arise in the case where the planar shape of the charge generating region was the aforementioned rectangular shape and where the signal charge collecting regions were arranged opposite to each other with the charge generating region in between in the direction in which the first and second long sides were opposed.

In the direction in which the first and second long sides are opposed, the charge generated in the charge generating region can be transferred at high speed because an electric field established by the transfer electrodes and the signal charge collecting regions acts on the charge. However, the electric field by the transfer electrodes and the signal charge collecting regions is less likely to act fully in the direction in which the first and second short sides are opposed. Particularly, it is difficult to quickly transfer the charge generated near the first and second short sides of the charge generating region.

By extending each of the signal charge collecting regions and the transfer electrodes in the direction in which the first and second short sides are opposed, it is possible to quickly transfer the charge generated near the first and second short sides of the charge generating region. However, if the area of the signal charge collecting regions is increased by the extension of the signal charge collecting regions in the direction in which the first and second short sides are opposed, the sensitivity of the range sensor will degrade for the following reason. The charge (Q) transferred into each signal charge collecting region causes a voltage change ($\Delta V$) represented by a relational expression below, because of the capacitance (Cfd) of the signal charge collecting region.

$$\Delta V = Q/Cfd$$

The increase in the area of the signal charge collecting region leads to an increase in the capacitance of the signal charge collecting region as well, so as to decrease the voltage change caused. Namely, it decreases a charge-voltage conversion gain. For this reason, the sensitivity of the range sensor becomes degraded.

In order to achieve the enhancement of the sensitivity of the range sensor, as described above, the area of the signal charge collecting regions has to be kept small. The length of the signal charge collecting regions in the direction in which the first and second short sides are opposed needs to be set smaller than the length of the charge generating region in the direction in which the first and second short sides are opposed. For this reason, even with extension of the transfer electrodes in the direction in which the first and second short sides are opposed, it is difficult to transfer the charge in the direction in which the first and second short sides are opposed, in the regions immediately below the transfer electrodes. The problem of low transfer rate of charge still remains unsolved.

It is an object of the present invention to provide a range sensor and a range image sensor capable of achieving the high-speed transfer of charge, while enhancing the sensitivity.

Solution to Problem

A range sensor according to the present invention is a range sensor comprising a charge generating region which generates charge according to incident light and a planar shape of which is a rectangular shape having first and second long sides opposed to each other and first and second short sides opposed to each other; at least a pair of signal charge collecting regions which are arranged opposite to each other with the charge generating region in between in a direction in which the first and second long sides are opposed and which collect signal charge from the charge generating region; transfer electrodes each of which is arranged between the signal charge collecting region and the charge generating region and to which respective charge transfer signals of different phases are supplied; and potential adjusting means which are arranged opposite to each other with the charge generating region in between in a direction in which the first and second short sides are opposed and which make a potential on the sides where the first and second short sides of the charge generating region exist, higher than a potential in a region located between at least the pair of signal charge collecting regions in the charge generating region.

In the range sensor according to the present invention, the potential adjusting means make the potential on the sides where the first and second short sides of the charge generating region exist, higher than the potential in the region located between at least the pair of signal charge collecting regions in the charge generating region. For this reason, the charge generated near the first and second short sides of the charge generating region becomes easier to migrate in the direction in which the first and second short sides are opposed, toward the region located between at least the pair of signal charge collecting regions in the charge generating region, because of a potential difference. The charge having migrated in the direction in which the first and second short sides are opposed, toward the region located between at least the pair of signal charge collecting regions in the charge generating region is quickly transferred by an electric field formed by the transfer electrode and the signal charge collecting region. Therefore, the charge generated in the charge generating region can be quickly transferred, even in the case where the area of the charge generating region is increased by setting the length thereof in the direction perpendicular to the direction in which the signal charge collecting regions are opposed, longer than the length thereof in the direction in which the signal charge collecting regions are opposed, i.e., where the planar shape of the charge generating region is the rectangular shape, and even in the case where the enhancement of sensitivity is achieved by setting the area of the signal charge collecting regions small.

The potential adjusting means may be semiconductor regions having the same conductivity type as the charge generating region and a higher impurity concentration than the charge generating region. In this case, since the impurity concentration of the semiconductor regions arranged opposite to each other with the charge generating region in between in the direction in which the first and second short sides are opposed is higher than that in the charge generating region, the potential difference is large. Since the semiconductor regions can be formed by adjustment of the impurity concentration, the potential adjusting means can be readily substantialized.

The range sensor may further comprise a photogate electrode arranged above the charge generating region and the potential adjusting means may be electrodes given an electrical potential lower than an electrical potential given to the photogate electrode. In this case, since the electrical potential given to the electrodes arranged opposite to each other with the charge generating region in between in the direction in which the first and second short sides are opposed is lower than the electrical potential given to the photogate electrode, the potential difference is large. The potential adjusting means can be readily substantialized by the simple configuration such as the electrodes.

A range image sensor according to the present invention is a range image sensor comprising: an imaging region consisting of a plurality of units arranged in a one-dimensional pattern or in a two-dimensional pattern, on a semiconductor substrate, and configured to obtain a range image, based on charge quantities output from the units, wherein one unit is the aforementioned range sensor. In the present invention, as described above, the charge generated in the charge generating region can be quickly transferred, even in the case where the planar shape of the charge generating region is the rectangular shape and in the case where the enhancement of sensitivity is achieved by setting the area of the signal charge collecting regions small.

Advantageous Effect of Invention

The present invention provides the range sensor and the range image sensor capable of achieving the quick transfer of charge, while achieving the enhancement of sensitivity.

BRIEF DESCRIPTION OF DRAWINGS

FIG. 7 is a drawing showing potential profiles, for explaining an accumulation operation of signal charge.

DESCRIPTION OF EMBODIMENTS

The preferred embodiments of the present invention will be described below in detail with reference to the accompanying drawings. In the description, the same elements or elements with the same functionality will be denoted by the same reference signs, without redundant description.

Figure 1:
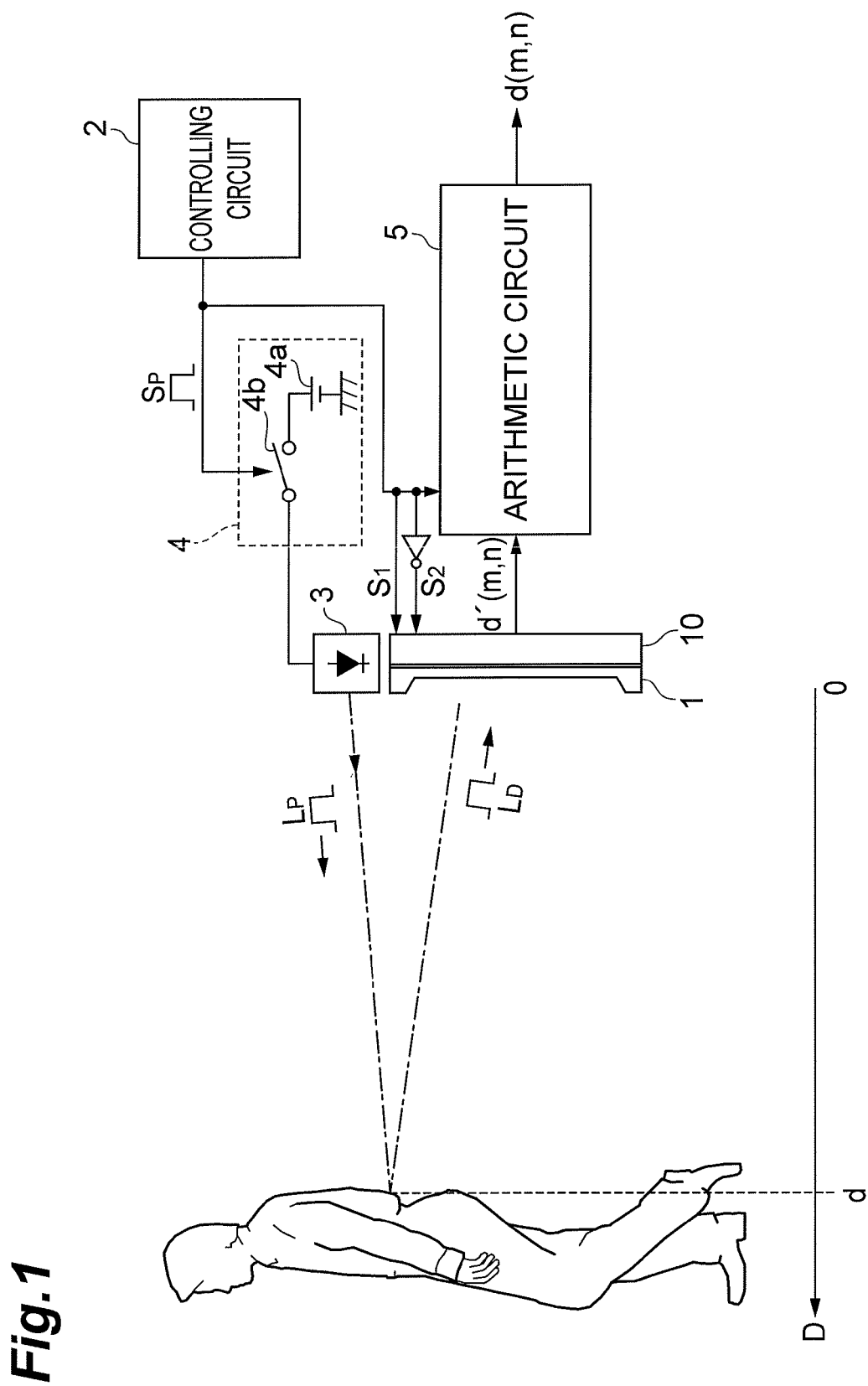
FIG. 1 is an explanatory drawing showing a configuration of a distance measuring device according to an embodiment of the present invention.

FIG. 1 is an explanatory drawing showing a configuration of a distance measuring device.

This distance measuring device is provided with a range image sensor 1, a light source 3 to emit near-infrared light, a driving circuit 4 to supply a pulse drive signal $S_P$ to the light source 3, a controlling circuit 2, and an arithmetic circuit 5. The controlling circuit 2 supplies detection gate signals $S_1$, $S_2$ in synchronism with the pulse drive signal $S_P$ to first and second gate electrodes (TX1, TX2: cf. FIG. 4) in each pixel of the range image sensor 1. The arithmetic circuit 5 calculates a distance to an object H such as a pedestrian, from signals d'(m, n) indicative of distance information read out from first and second semiconductor regions (FD1-FD2: cf. FIG. 4) of the range image sensor 1. The distance in the horizontal direction D from the range image sensor 1 to the object H is represented by d.

The controlling circuit 2 feeds the pulse drive signal $S_P$ to a switch 4b of the driving circuit 4. The light source 3 for projection of light consisting of an LED or a laser diode is connected via the switch 4b to a power supply 4a. Therefore, when the pulse drive signal $S_P$ is supplied to the switch 4b, a drive current of the same waveform as the pulse drive signal $S_P$ is supplied to the light source 3 and the light source 3 outputs pulsed light $L_P$ as probe light for distance measurement.

When the pulsed light $L_P$ is irradiated on the object H, the object H reflects the pulsed light. Then the reflected light is incident as pulsed light $L_D$ into the range image sensor 1 and the range image sensor 1 outputs a pulse detection signal $S_D$.

The range image sensor 1 is fixed on a wiring board 10. Signals d'(m, n) having distance information are output from each pixel through wiring on the wiring board 10.

Supposing the waveform of the pulse drive signal $S_P$ is a rectangular wave with the period T and its high level is represented by "1" and low level by "0," the voltage V(t) thereof is given by the following formulae.

Pulse Drive Signal $S_P$:

$V(t)=1$ (in the case of $0<t<(T/2)$);

$V(t)=0$ (in the case of $(T/2)<t<T$);

$V(t+T)=V(t)$.

The waveforms of the detection gate signals $S_1$, $S_2$ are rectangular waves with the period T and the voltage V(t) thereof is given by the following formulae.

Detection Gate Signal $S_1$:

$V(t)=1$ (in the case of $0<t<(T/2)$);

$V(t)=0$ (in the case of $(T/2)<t<T$);

$V(t+T)=V(t)$.

Detection Gate Signal $S_2$ (=Inversion of $S_1$):

$V(t)=0$ (in the case of $0<t<(T/2)$);

$V(t)=1$ (in the case of $(T/2)<t<T$);

$V(t+T)=V(t)$.

The foregoing pulse signals $S_P$, $S_1$, $S_2$, $S_D$ all have the pulse period $2\times T_P$. Let us define Q1 as a charge quantity generated in the range image sensor 1 when both the detection gate signal $S_1$ and the pulse detection signal $S_D$ are "1." Q2 is defined as a charge quantity generated in the range image sensor 1 when both the detection gate signal $S_2$ and the pulse detection signal $S_D$ are "1."

A phase difference between one detection gate signal $S_1$ and the pulse detection signal $S_D$ in the range image sensor 1 is proportional to the charge quantity Q2 generated in the range image sensor 1, in an overlap duration in which the other detection gate signal $S_2$ and the pulse detection signal $S_D$ are "1." Namely, the charge quantity Q2 is a charge quantity generated in the duration in which AND of the detection gate signal $S_2$ and the pulse detection signal $S_D$ is "1." When a total charge quantity generated in one pixel is Q1+Q2 and the pulse width of a half period of the drive signal $S_P$ is $T_P$, the pulse detection signal $S_D$ lags behind the drive signal $S_P$ by a time of $\Delta t=T_P \times Q2/(Q1+Q2)$. The time of flight $\Delta t$ of one light pulse is given by $\Delta t=2d/c$, where d is the distance to the object and c the speed of light. Therefore, when two charge quantities (Q1, Q2) are output as signals d'(m, n) having the distance information from a specific pixel, the arithmetic circuit 5 calculates the distance $d=(c\times\Delta t)/2=c\times T_P \times Q2/(2\times(Q1+Q2))$ to the object H, based on the input charge quantities Q1, Q2 and the known half-period pulse width $T_P$.

As described above, the arithmetic circuit 5 can calculate the distance d by separately reading out the charge quantities Q1, Q2. The foregoing pulses are repeatedly emitted and integral values thereof can be output as respective charge quantities Q1, Q2.

The ratio to the total charge quantity of the charge quantities Q1, Q2 corresponds to the aforementioned phase difference, i.e., to the distance to the object H. The arithmetic circuit 5 calculates the distance to the object H according to this phase difference. As described above, when the time difference corresponding to the phase difference is represented by $\Delta t$, the distance d is preferably given by $d=(c\times\Delta t)/2$, but an appropriate correction operation may be performed in addition thereto. For example, if an actual distance is different from the calculated distance d, a factor β to correct the latter is preliminarily obtained and the finally calculated distance d can be determined by multiplying the calculated distance d by the factor β in a product after shipped. Another available correction is such that the ambient temperature is measured, an operation to correct the speed of light c is performed if the speed of light c differs depending upon the ambient temperature, and then the distance calculation is performed. The distance may also be determined by a lookup table method, while preliminarily storing a relation between signals input into the arithmetic circuit and actual distances in a memory. The calculation method can be modified depending upon the sensor structure and the conventionally known calculation methods can be applied thereto.

Figure 2:
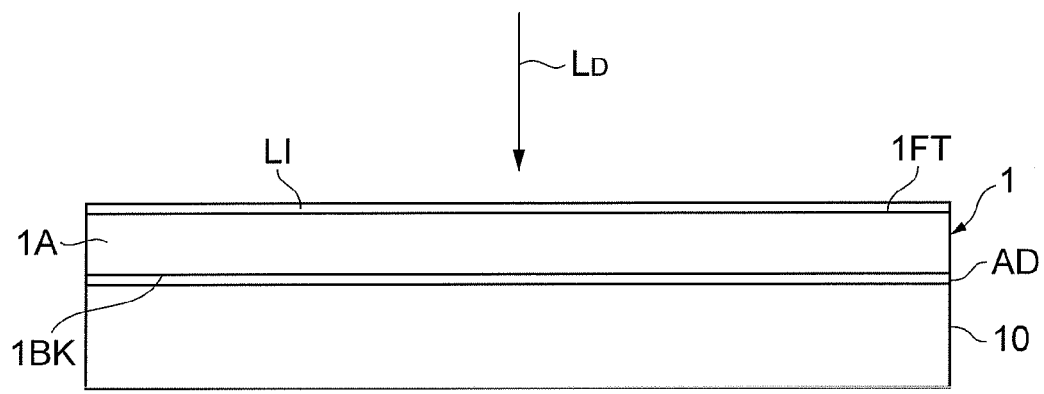
FIG. 2 is a drawing for explaining a cross-sectional configuration of a range image sensor.

FIG. 2 is a drawing for explaining a cross-sectional configuration of the range image sensor.

The range image sensor 1 is a range image sensor of a front illuminated type and is provided with a semiconductor substrate 1A. The pulsed light $L_D$ is incident through a light incident surface 1FT of the semiconductor substrate 1A into the range image sensor 1. A back surface 1BK opposite to the light incident surface 1FT of the range image sensor 1 is connected through an adhesive region AD to the wiring board 10. The adhesive region AD has an insulating adhesive and filler. The range image sensor 1 is provided with a light shielding layer LI having an aperture at a predetermined position. The light shielding layer LI is arranged in front of the light incident surface 1FT.

Figure 3:
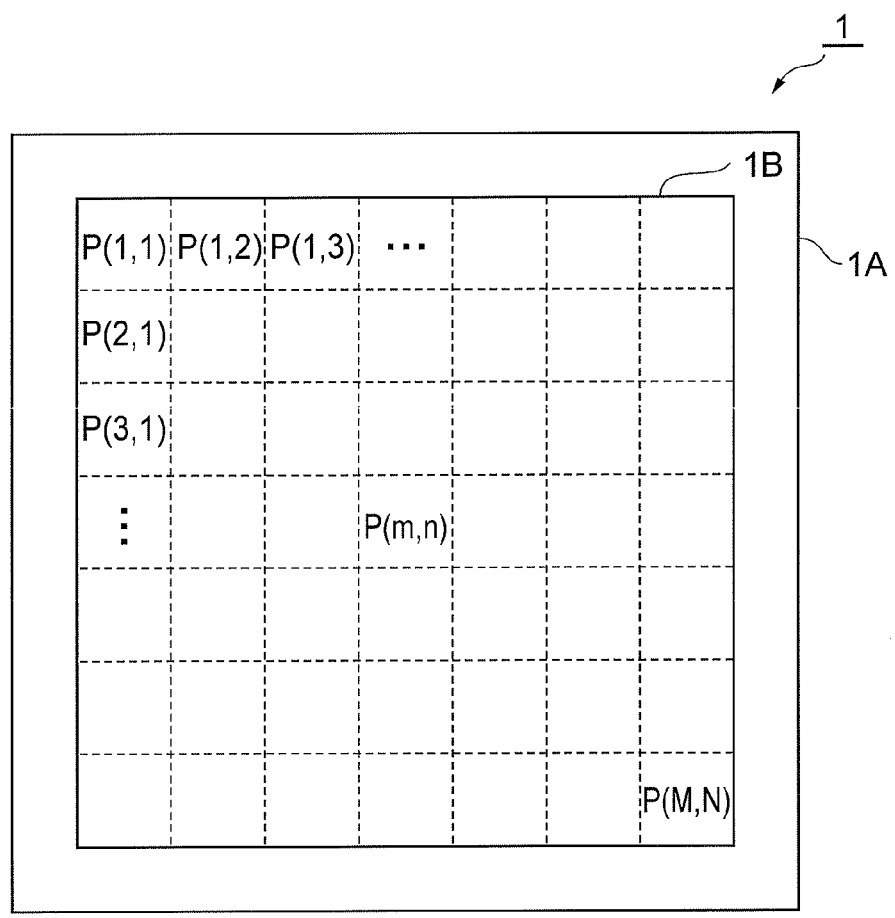
FIG. 3 is a schematic plan view of the range image sensor.

FIG. 3 is a schematic plan view of the range image sensor.

In the range image sensor 1, the semiconductor substrate 1A has an imaging region 1B consisting of a plurality of pixels P(m, n) arrayed in a two-dimensional pattern. Each pixel P(m, n) outputs two charge quantities (Q1, Q2) as the aforementioned signals d'(m, n) having the distance information. Each pixel P(m,n) functions as a microscopic distance measuring sensor to output the signals d'(m,n) according to the distance to the object H. Therefore, when the reflected light from the object H is focused on the imaging region 1B, the sensor is able to obtain a range image of the object as a collection of distance information to respective points on the object H. One pixel P(m, n) functions as a range sensor.

Figure 4:
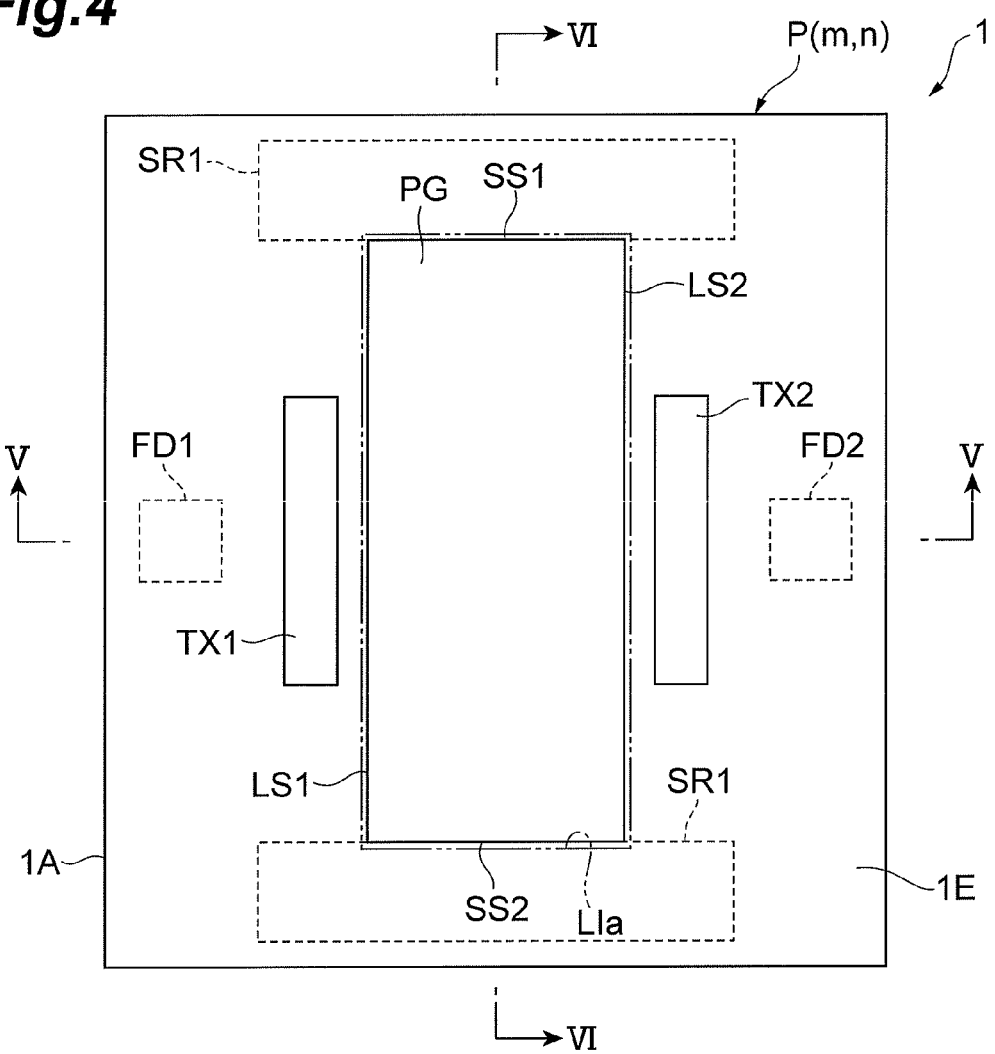
FIG. 4 is a schematic drawing for explaining a configuration of a pixel in the range image sensor.
Figure 5:
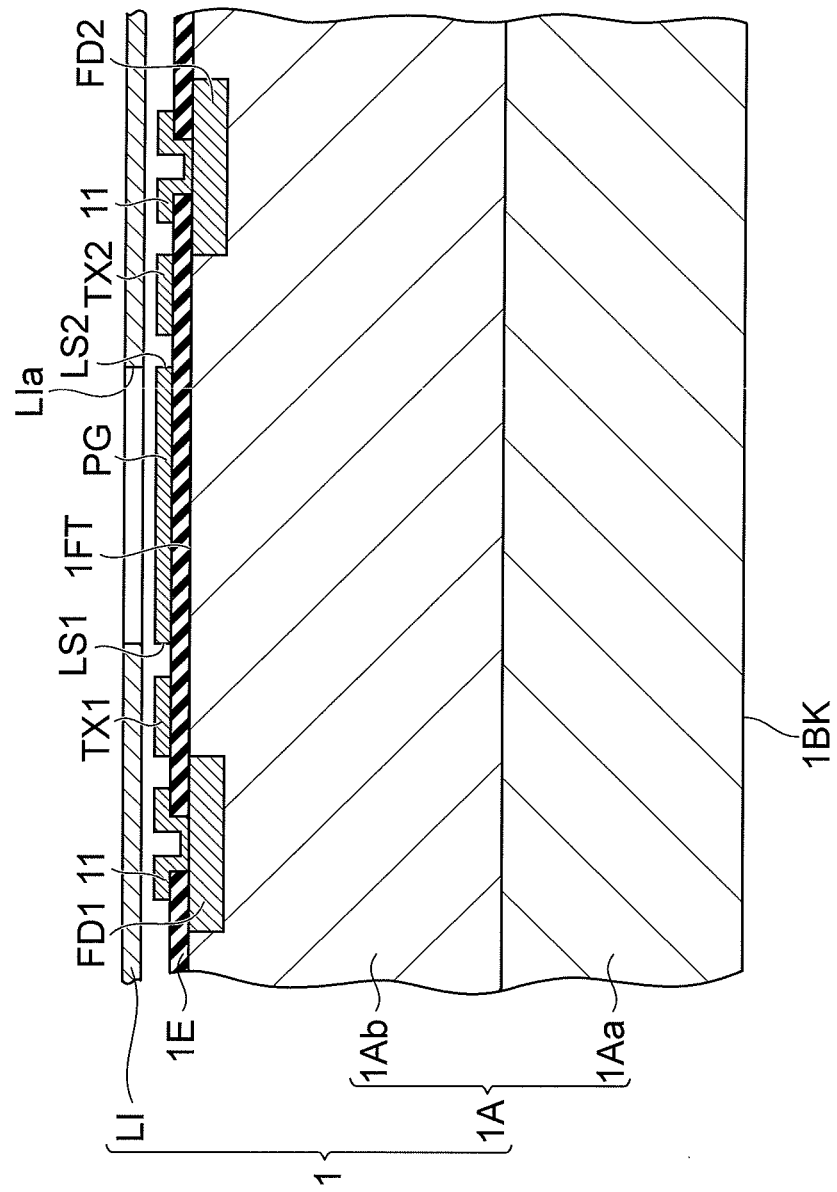
FIG. 5 is a drawing showing a cross-sectional configuration along the line V-V in FIG. 4.
Figure 6:
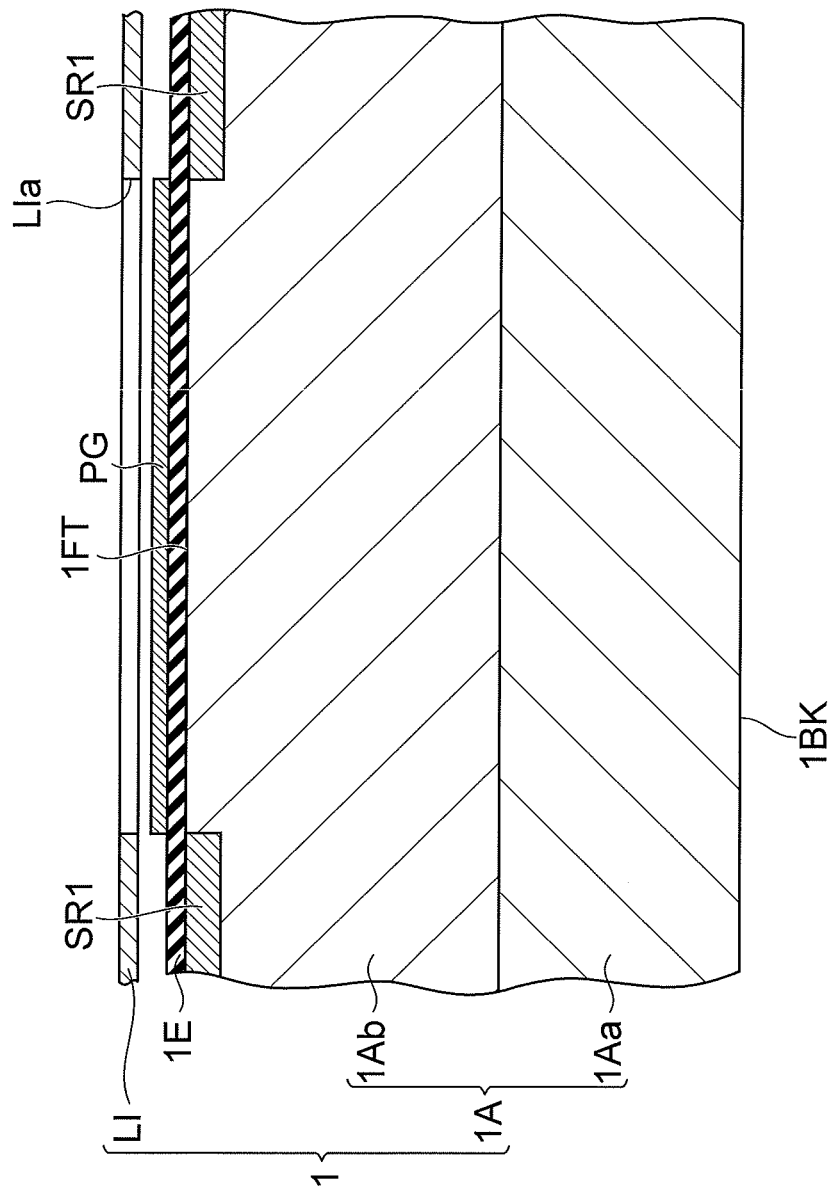
FIG. 6 is a drawing showing a cross-sectional configuration along the line VI-VI in FIG. 4.

FIG. 4 is a schematic view for explaining a configuration of a pixel in the range image sensor. FIG. 5 is a drawing showing a cross-sectional configuration along the line V-V in FIG. 4. FIG. 6 is a drawing showing a cross-sectional configuration along the line VI-VI in FIG. 4. In FIG. 4, illustration of conductors 11 is omitted.

The range image sensor 1 is provided with the semiconductor substrate 1A having the light incident surface 1FT and the back surface 1BK opposed to each other. The semiconductor substrate 1A consists of a p-type first region 1Aa located on the back surface 1BK side, and a p⁻ type second region 1Ab having a lower impurity concentration than the first region 1Aa and located on the light incident surface 1FT side. The semiconductor substrate 1A can be obtained, for example, by growing on a p-type semiconductor substrate, a p⁻ type epitaxial layer with a lower impurity concentration than the semiconductor substrate.

The range image sensor 1 has, in each pixel P(m,n), a photogate electrode PG, first and second gate electrodes TX1, TX2, first and second semiconductor regions FD1, FD2, and a pair of third semiconductor regions SR1. The photogate electrode PG is provided through an insulating layer 1E on the light incident surface 1FT. The first and second gate electrodes TX1, TX2 are provided adjacent to the photogate electrode PG through the insulating layer 1E on the light incident surface 1FT. The first and second semiconductor regions FD1, FD2 accumulate charge flowing into regions immediately below the respective gate electrodes TX1, TX2. The third semiconductor regions SR1 are arranged as separated from each other at the sides different from the sides where the first and second semiconductor regions FD1, FD2 are arranged, and have a conductivity type opposite to that of the first and second semiconductor regions FD1, FD2. In the present example the semiconductor substrate 1A is comprised of Si and the insulating layer 1E of $SiO_2$.

The photogate electrode PG has a planar shape which is a rectangular shape having first and second long sides LS1, LS2 opposed to each other and first and second short sides SS1, SS2 opposed to each other. In the present embodiment, a ratio of the length of the first and second short sides SS1, SS2 to the length of the first and second long sides LS1, LS2 is set, for example, to about 1:2 to 1:15. The photogate electrode PG is comprised of polysilicon, but may be comprised of another material.

A region corresponding to the photogate electrode PG (region immediately below the photogate electrode PG) in the semiconductor substrate 1A functions as a charge generating region to generate charge according to incident light. Therefore, the charge generating region has a planar shape corresponding to the photogate electrode PG, i.e., a rectangular shape having first and second long sides opposed to each other and first and second short sides opposed to each other.

The first semiconductor region FD1 is arranged along the first long side LS1 on the side where the first long side LS1 of the photogate electrode PG exists. The second semiconductor region FD2 is arranged along the second long side LS2 on the side where the second long side LS2 of the photogate electrode PG exists. The first semiconductor region FD1 and the second semiconductor region FD2 are opposed to each other with the photogate electrode PG in between in the direction in which the first and second long sides LS1, LS2 are opposed. The first and second semiconductor regions FD1, FD2 are rectangular on the plan view. A ratio of the length in the direction in which the first and second long sides LS1, LS2 are opposed and in the direction in which the first and second short sides SS1, SS2 are opposed, of the first and second semiconductor regions FD1, FD2 is set, for example, to about 1:0.5 to 1:2. In the present embodiment, the first and second semiconductor regions FD1, FD2 are square. The first and second semiconductor regions FD1, FD2 function as signal charge collecting regions.

The first gate electrode TX1 is provided between the photogate electrode PG and the first semiconductor region FD1. The second gate electrode TX2 is provided between the photogate electrode PG and the second semiconductor region FD2. The first and second gate electrodes TX1, TX2 are rectangular on the plan view. In the present embodiment, the first and second gate electrodes TX1, TX2 have a rectangular shape the long-side direction of which is the direction in which the first and second short sides SS1, SS2 are opposed. A ratio of the length in the short-side direction of the first and second gate electrodes TX1, TX2 to the length in the long-side direction of the first and second gate electrodes TX1, TX2, i.e., in the direction in which the first and second short sides SS1, SS2 of the photogate electrode PG are opposed, is set, for example, to about 1:2 to 1:15. The first and second gate electrodes TX1, TX2 are comprised of polysilicon, but these may be comprised of another material. The first and second gate electrodes TX1, TX2 function as transfer electrodes.

The third semiconductor regions SR1 are arranged along the first and second short sides SS1, SS2, respectively, on the sides where the first and second short sides SS1, SS2 of the photogate electrode PG exist. Namely, the third semiconductor regions SR1 are arranged opposite to each other with the photogate electrode PG (charge generating region) in between in the direction in which the first and second short sides SS1, SS2 are opposed. The third semiconductor regions SR1 are rectangular on the plan view. In the present embodiment, the third semiconductor regions SR1 have a rectangular shape the long-side direction of which is the direction in which the first and second long sides LS1, LS2 are opposed.

The first and second semiconductor regions FD1, FD2 are regions comprised of an n-type, semiconductor with a high impurity concentration, and floating diffusion regions. The third semiconductor regions SR1 are regions having the same conductivity type as the semiconductor substrate 1A and a higher impurity concentration than the semiconductor substrate 1A, i.e., regions comprised of a p-type semiconductor with a high impurity concentration. The third semiconductor regions SR1 may be p-type well regions or may be p-type diffusion regions.

The thicknesses/impurity concentrations of the respective regions are as described below.

First region 1Aa of semiconductor substrate 1A: thickness 5-700 μm/impurity concentration $1 \times 10^{18}$-$10^{20}$ cm$^{-3}$ Second region 1Ab of semiconductor substrate 1A: thickness 3-30 μm/impurity concentration $1 \times 10^{13}$-$10^{16}$ cm$^{-3}$ First and second semiconductor regions FD1, FD2: thickness 0.1-0.4 μm/impurity concentration $1 \times 10^{18}$-$10^{20}$ cm$^{-3}$ Third semiconductor regions SR1: thickness 1-5 μm/impurity concentration $1 \times 10^{16}$-$10^{18}$ cm$^3$ The insulating layer 1E is provided with contact holes for exposing the surfaces of the first and second semiconductor regions FD1, FD2. Conductors 11 to connect the first and second semiconductor regions FD1, FD2 to the outside are arranged in the contact holes.

The light shielding layer LI has an aperture LIa formed at a position corresponding to the photogate electrode PG. Therefore, light is incident through the opening LIa of the light shielding layer LI into the semiconductor substrate 1A (the region immediately below the photogate electrode PG). The regions where the first and second semiconductor regions FD1, FD2 are arranged in the semiconductor substrate 1A, are covered by the light shielding layer LI, so as to prevent the light from being incident the first and second semiconductor regions FD1, FD2. This can prevent generation of unnecessary charge due to light incident on the first and second semiconductor regions FD1, FD2. The light shielding layer LI is comprised, for example, of a metal such as aluminum.

When a high-level signal (positive electrical potential) is supplied to the first and second gate electrodes TX1, TX2, a potential below the first and second gate electrodes TX1, TX2 becomes lower than a potential of the region immediately below the photogate electrode PG in the semiconductor substrate 1A. This results in drawing negative charge (electrons) toward the first and second gate electrodes TX1, TX2 and accumulating the negative charge in potential wells formed by the first and second semiconductor regions FD1, FD2. An n-type semiconductor contains a positively ionized donor and has a positive potential, so as to attract electrons. When a low-level signal (ground electrical potential) is supplied to the first and second gate electrodes TX1, TX2, the first and second gate electrodes TX1, TX2 form potential barriers. Therefore, the charge generated in the semiconductor substrate 1A is not drawn into the first and second semiconductor regions FD1, FD2.

In the range image sensor 1, the charge generated in the deep portion of semiconductor in response to incidence of light for projection of light is drawn into the potential wells formed on the light incident surface 1FT side. This enables fast and accurate distance measurement.

The pulsed light $L_D$ from the object, which is incident through the light incident surface 1FT of the semiconductor substrate 1A, reaches to the region immediately below the photogate electrode PG provided on the front surface side of the semiconductor substrate 1A. Charge generated in the semiconductor substrate 1A with incidence of the pulsed light is distributed from the region immediately below the photogate electrode PG into the regions immediately below the first and second gate electrodes TX1, TX2 adjacent thereto. Namely, when the detection gate signals $S_1$, $S_2$ in synchronism with the drive signal $S_P$ of the light source are alternately supplied through the wiring board 10 to the first and second gate electrodes TX1, TX2, charges generated in the region immediately below the photogate electrode PG flow respectively to the regions immediately below the first and second gate electrodes TX1, TX2 and then flow therefrom into the first and second semiconductor regions FD1, FD2.

The ratio to the total charge quantity (Q1+Q2), of the charge quantity Q1, Q2 accumulated in the first semiconductor region FD1 or in the second semiconductor region FD2 corresponds to the phase difference between the emitted pulsed light, which was emitted with supply of the drive signal $S_P$ to the light source, and the detected pulsed light, which returned after reflection of the emitted pulsed light from the object H.

The range image sensor 1 is provided with a back gate semiconductor region for fixing the electrical potential of the semiconductor substrate 1A to a reference electrical potential, which is not illustrated.

Figure 8:
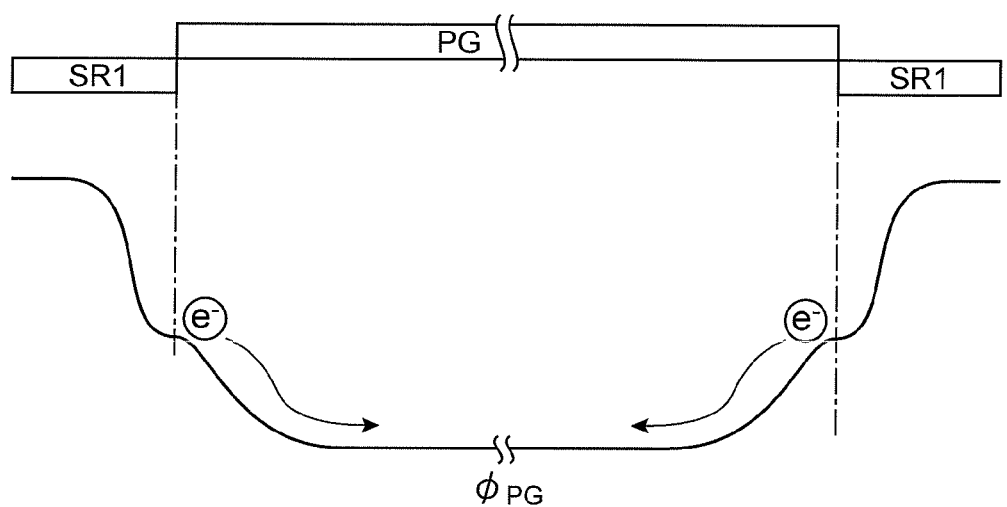
FIG. 8 is a drawing showing a potential profile, for explaining the accumulation operation of signal charge.

FIGS. 7 and 8 are drawings showing potential profiles near the light incident surface 1FT of the semiconductor substrate 1A, for explaining the accumulation operation of signal charge. In FIGS. 7 and 8, the downward direction corresponds to the positive direction of potential.

Upon incidence of light, the potential $\Phi_{PG}$ of the region immediately below the photogate electrode PG is set slightly higher than the substrate potential, by the electrical potential given to the photogate electrode PG (intermediate electrical potential between the higher electrical potential and the lower electrical potential given to the first and second gate electrodes TX1, TX2). Shown in the drawings are the potential $\Phi_{TX1}$ of the region immediately below the first gate electrode TX1, the potential $\Phi_{TX2}$ of the region immediately below the second gate electrode TX2, the potential $\Phi_{FD1}$ of the first semiconductor region FD1, and the potential $\Phi_{FD2}$ of the second semiconductor region FD2.

When the high electrical potential of the detection gate signal $S_1$ is applied to the first gate electrode TX1, the charge generated immediately below the photogate electrode PG flows through the region immediately below the first gate electrode TX1 in accordance with a potential gradient to be accumulated in the potential well of the first semiconductor region FD1, as shown in (a) of FIG. 7. The charge quantity Q1 is accumulated in the potential well of the first semiconductor region FD1.

At this time, as shown in FIG. 8, the potential $\Phi_{PG}$ of the region immediately below the photogate electrode PG is raised on the sides of the first and second short sides SS1, SS2 by the arrangement of the third semiconductor regions SR1. Therefore, a potential gradient decreasing from the sides of the first and second short sides SS1, SS2 toward the region located between the first and second semiconductor regions FD1, FD2 is formed in the region immediately below the photogate electrode PG.

The charge generated near the first and second short sides SS1, SS2 in the region immediately below the photogate electrode PG is accelerated according to the potential gradient formed by the third semiconductor regions SR1, to quickly migrate toward the region located between the first and second semiconductor regions FD1, FD2. Then the migrating charge is accumulated in the potential well of the first semiconductor region FD1 through the region immediately below the first gate electrode TX1 in accordance with the potential gradient formed by an electric field established by the first gate electrode TX1 and the first semiconductor region FD1, as described above.

When the high electrical potential of the detection gate signal $S_2$ is applied to the second gate electrode TX2 in succession to the detection gate signal $S_1$, the charge generated immediately below the photogate electrode PG flows through the region immediately below the second gate electrode TX2 in accordance with a potential gradient to be accumulated in the potential well of the second semiconductor region FD2, as shown in (b) of FIG. 7. The charge quantity Q2 is accumulated in the potential well of the second semiconductor region FD2.

At this time, as shown in FIG. 8, the potential $\Phi_{PG}$ of the region immediately below the photogate electrode PG is also raised on the sides of the first and second short sides SS1, SS2 by the arrangement of the third semiconductor regions SR1. Therefore, a potential gradient decreasing from the sides of the first and second short sides SS1, SS2 toward the region located between the first and second semiconductor regions FD1, FD2 is formed in the region immediately below the photogate electrode PG.

The charge generated near the first and second short sides SS1, SS2 in the region immediately below the photogate electrode PG is accelerated according to the potential gradient formed by the third semiconductor regions SR1, to quickly migrate toward the region located between the first and second semiconductor regions FD1, FD2. Then the migrating charge is accumulated in the potential well of the second semiconductor region FD2 through the region immediately below the second gate electrode TX2 in accordance with the potential gradient formed by an electric field established by the second gate electrode TX2 and the second semiconductor region FD2, as described above.

Figure 9:
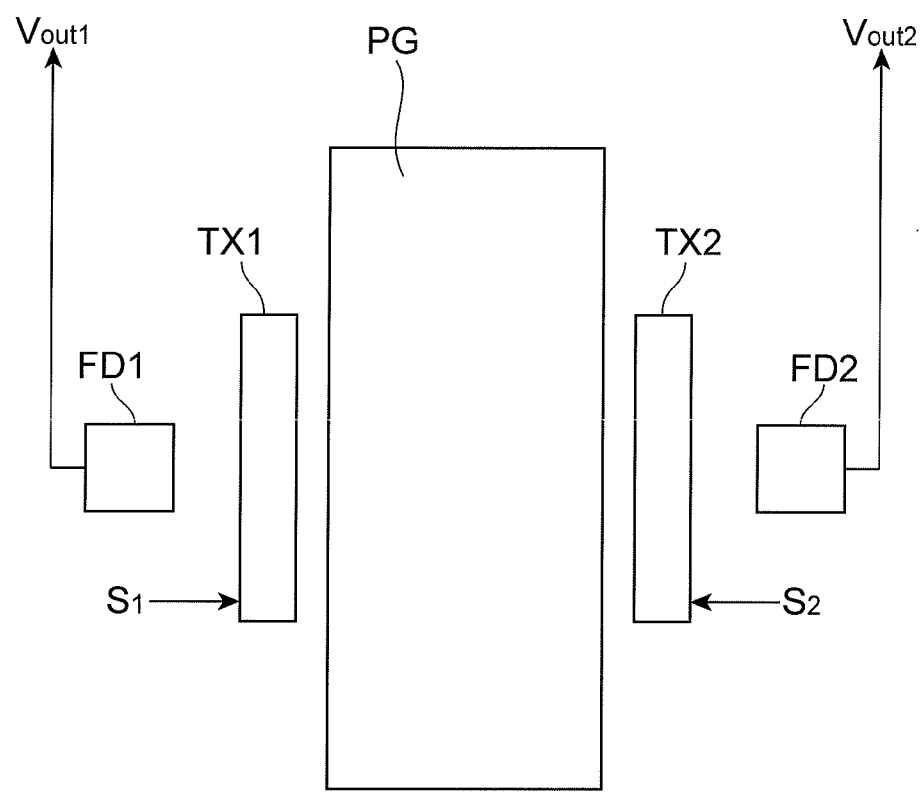
FIG. 9 is a schematic drawing for explaining a configuration of a pixel.

FIG. 9 is a schematic drawing for explaining a configuration of a pixel.

The detection gate signal $S_1$ is supplied to the first gate electrode TX1. The detection gate signal $S_2$ is supplied to the second gate electrode TX2. Namely, the charge transfer signals of different phases are supplied respectively to the first gate electrode TX1 and to the second gate electrode TX2.

When the detection gate signal $S_1$ of the high level is supplied to the first gate electrode TX1, the charge generated in the region immediately below the photogate electrode PG flows as signal charge into the potential well composed of the first semiconductor region FD1. The signal charge accumulated in the first semiconductor region FD1 is read out as output ($V_{out1}$) corresponding to the accumulated charge quantity $Q_1$ from the first semiconductor region FD1. When the detection gate signal $S_2$ of the high level is supplied to the second gate electrode TX2, the charge generated in the region immediately below the photogate electrode PG flows as signal charge into the potential well composed of the second semiconductor region FD2. The signal charge accumulated in the second semiconductor region FD2 is read out as output ($V_{out2}$) corresponding to the accumulated charge quantity $Q_2$ from the second semiconductor region FD2. These outputs ($V_{out1}$, $V_{out2}$) correspond to the aforementioned signals d'(m, n).

Figure 10:
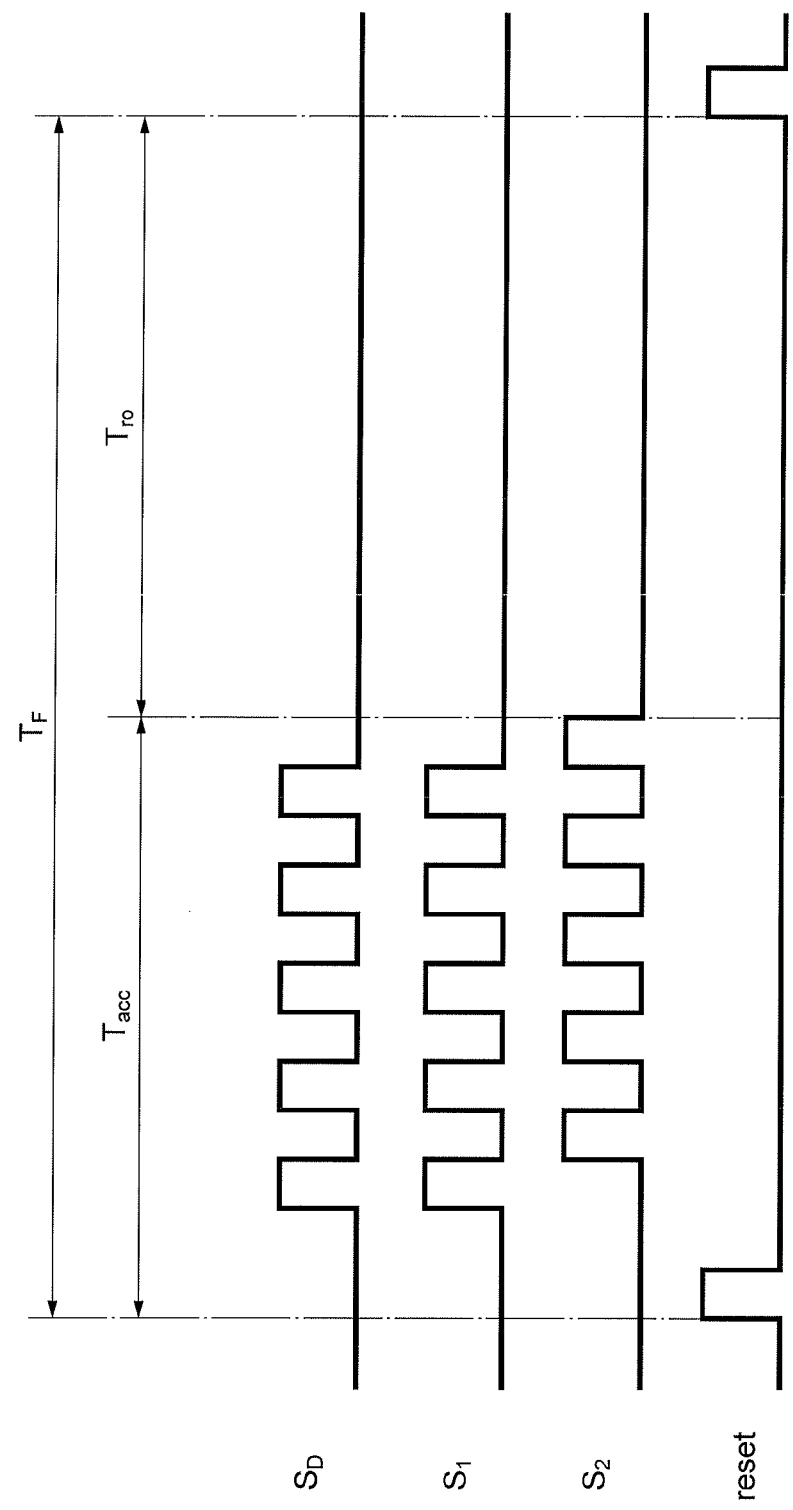
FIG. 10 is a timing chart of various signals.

FIG. 10 is a timing chart of actual various signals.

A period $T_F$ of one frame consists of a period for accumulation of signal charge (accumulation period) $T_{acc}$, and a period for readout of signal charge (readout period) $T_{ro}$. With focus on one pixel, a signal based on the pulse drive signal $S_P$ having a plurality of pulses is applied to the light source during the accumulation period $T_{acc}$ and, in synchronism therewith, the detection gate signals $S_1$, $S_2$ are applied in mutually opposite phases to the first and second gate electrodes TX1, TX2. Prior to the distance measurement, a reset signal reset is applied to the first and second semiconductor regions FD1, FD2 to discharge charge accumulated inside, to the outside. In the present example, the reset signal reset is instantaneously turned on and then turned off, and thereafter a plurality of drive oscillating pulses are sequentially applied. Furthermore, in synchronism therewith, the charge transfer is sequentially performed to accumulate the signal charge in the first and second semiconductor regions FD1, FD2 in an integrating manner. Thereafter, during the readout period $T_{ro}$, the signal charges accumulated in the first and second semiconductor regions FD1, FD2 are read out.

For distribution of charge, normally, a positive high-level detection signal is supplied to one gate electrode (e.g., the first gate electrode TX1) out of the first gate electrode TX1 and the second gate electrode TX2, and a detection signal with a phase shift of 180° is supplied to the other gate electrode (e.g., the second gate electrode TX2). In this operation, when the lower level (e.g., the ground electrical potential) is applied as the detection signal applied to the other gate electrode (e.g., the second gate electrode TX2), the potential immediately below the second gate electrode TX2 is raised to form a potential peak. This makes the charge hard to flow from the photogate electrode PG side to the second semiconductor region FD2, which can suppress generation of unnecessary noise component.

In the present embodiment, as described above, the planar shape of the photogate electrode PG is set to be the rectangular shape. This increases the area of the region immediately below the photogate electrode PG (charge generating region), so as to enhance the sensitivity of the range image sensor 1 and increase the transfer rate of charge to the first and second semiconductor regions FD1, FD2.

In the present embodiment, the first and second semiconductor regions FD1, FD2 are set so that the length thereof in the direction in which the first and second short sides SS1, SS2 are opposed is extremely smaller than the length of the photogate electrode PG in the direction in which the first and second short sides SS1, SS2 are opposed, and so that the area of the first and second semiconductor regions FD1, FD2 is also smaller than the area of the photogate electrode PG. For this reason, the area of the first and second semiconductor regions FD1, FD2 is relatively significantly reduced relative to the area of the region available for transfer of charge to the first and second semiconductor regions FD1, FD2 in the region immediately below the photogate electrode PG (charge generating region). The charges transferred and accumulated in the first and second semiconductor regions FD1, FD2 (charge quantities Q1, Q2) cause respective voltage changes (ΔV) represented by relational expressions below, because of the capacitance (Cfd) of the first and second semiconductor regions FD1, FD2.

$$\Delta V = Q1/Cfd$$

$$\Delta V = Q2/Cfd$$

Therefore, the decrease in the area of the first and second semiconductor regions FD1, FD2 also leads to a decrease in the capacitance (Cfd) of the first and second semiconductor regions FD1, FD2, so as to cause larger voltage changes (ΔV). Namely, it results in increasing a charge-voltage conversion gain. From this point as well, the sensitivity of the range image sensor 1 is enhanced.

Incidentally, in the present embodiment the third semiconductor regions SR1 make the potential on the sides of the first and second short sides SS1, SS2 in the region (charge generating region) immediately below the photogate electrode PG, higher than the potential in the region located between the first and second semiconductor regions FD1, FD2, so as to form the potential gradient decreasing toward the region located between the first and second semiconductor regions FD1, FD2. For this reason, the charge generated near the first and second short sides SS1, SS2 in the region immediately below the photogate electrode PG becomes easier to migrate in the direction in which the first and second short sides SS1, SS2 are opposed, toward the region located between the first and second semiconductor regions FD1, FD2, because of the aforementioned potential gradient. The charge having migrated in the direction in which the first and second short sides SS1, SS2 are opposed, from the sides of the first and second short sides SS1, SS2 toward the region located between the first and second semiconductor regions FD1, FD2 is quickly transferred by the electric field established by the first gate electrode TX1 and the first semiconductor region FD1 or by the electric field established by the second gate electrode TX2 and the second semiconductor region FD2. Accordingly, the charge generated in the region immediately below the photogate electrode PG can be quickly transferred, even in the case where the area is increased by setting the planar shape of the photogate electrode PG (charge generating region) to the rectangular shape and in the case where the enhancement of sensitivity is achieved by setting the area of the first and second semiconductor regions FD1, FD2 extremely small.

In the present embodiment, the third semiconductor regions SR1 are formed by adjusting the impurity concentration of the semiconductor substrate 1A. For this reason, the present embodiment can readily substantialize the configuration for making the potential on the sides of the first and second short sides SS1, SS2 in the region immediately below the photogate electrode PG, higher than the potential in the region located between the first and second semiconductor regions FD1, FD2.

Figure 11:
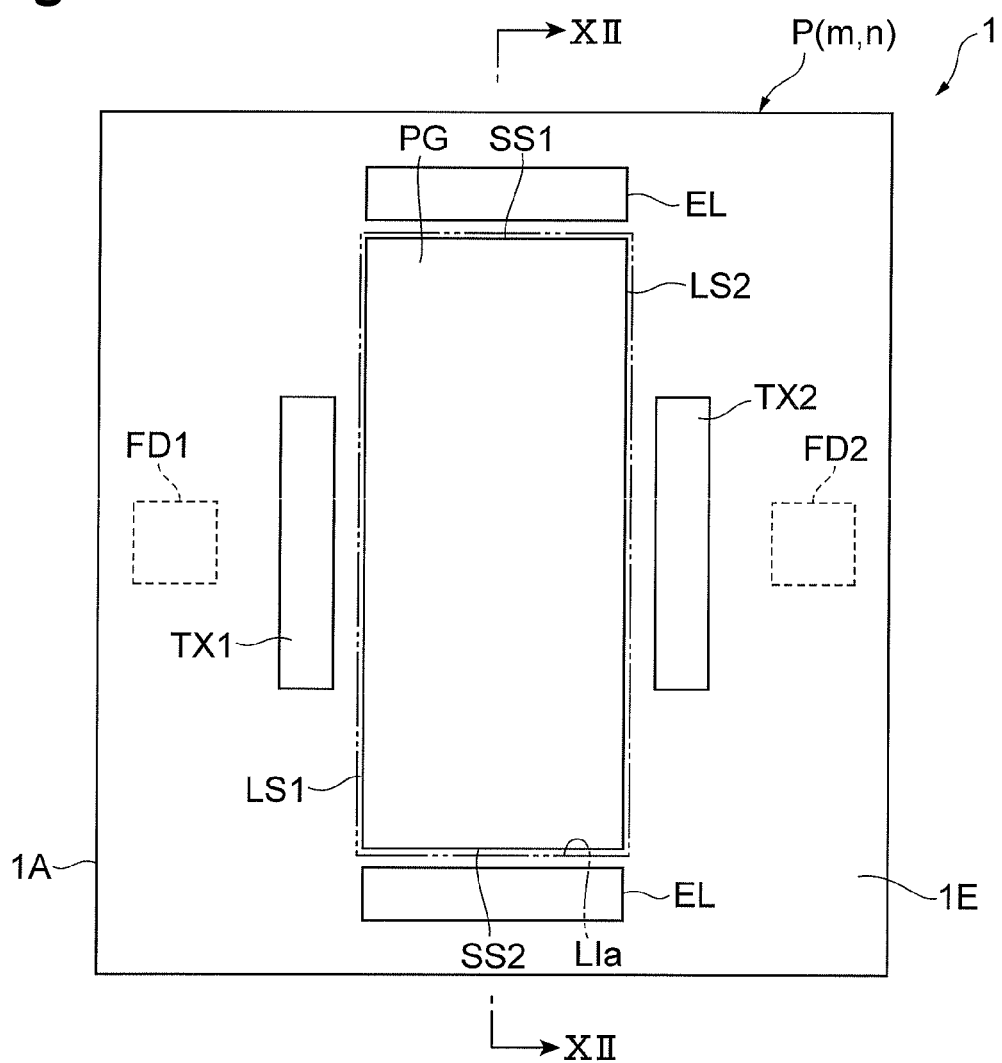
FIG. 11 is a schematic drawing for explaining a configuration of a pixel in a modification example of the range image sensor.
Figure 12:
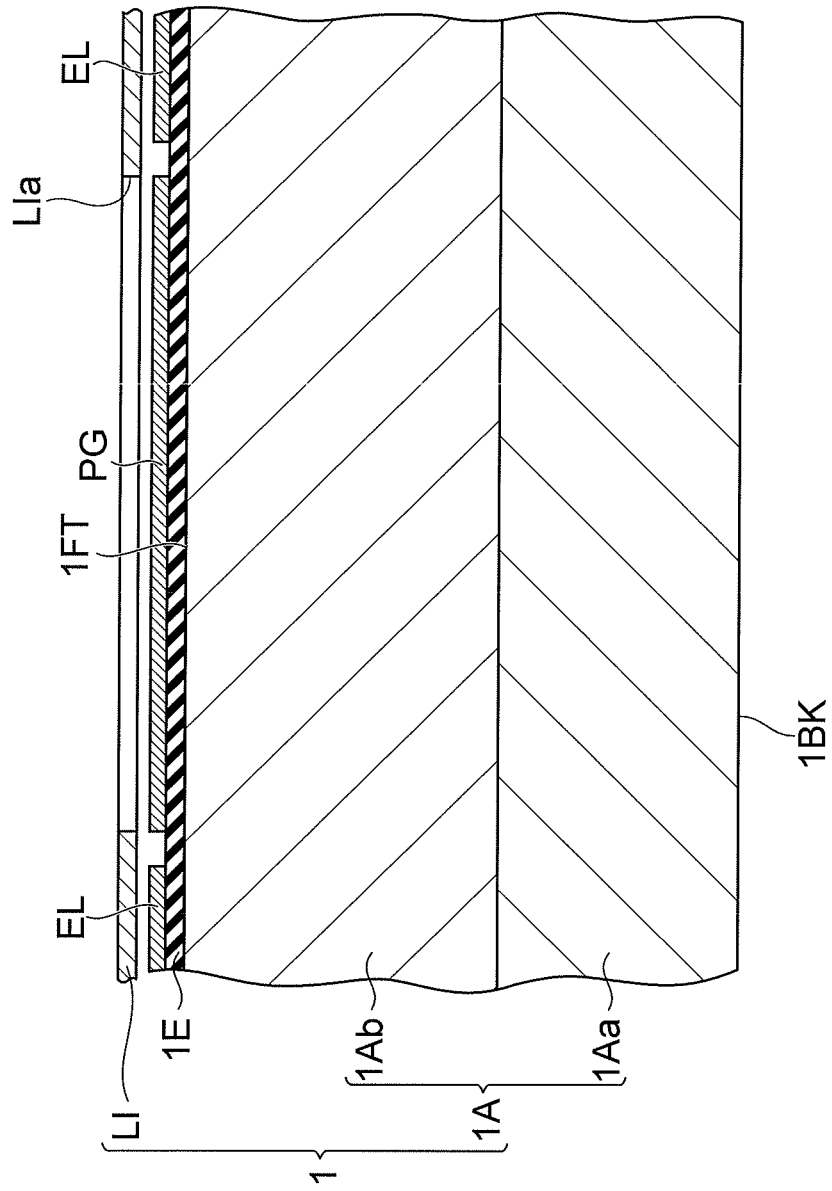
FIG. 12 is a drawing showing a cross-sectional configuration along the line XII-XII in FIG. 11.

Next, a modification example of the range image sensor 1 will be described with reference to FIGS. 11 and 12. FIG. 11 is a schematic drawing for explaining a configuration of a pixel in the modification example of the range image sensor. FIG. 12 is a drawing showing a cross-sectional configuration along the line XII-XII in FIG. 11. The present modification example is different from the above embodiment in that the sensor is provided with potential adjusting electrodes EL, instead of the third semiconductor regions SR1. In FIG. 11, the illustration of conductors 11 is omitted.

The range image sensor 1 has, in each pixel P(m, n), a photogate electrode PG, first and second gate electrodes TX1, TX2, first and second semiconductor regions FD1, FD2, and a pair of potential adjusting electrodes EL. The potential adjusting electrodes EL are provided adjacent to the photogate electrode PG through the insulating layer 1E on the light incident surface 1FT.

The potential adjusting electrodes EL are arranged along the first and second short sides SS1, SS2, respectively, on the sides where the first and second short sides SS1, SS2 of the photogate electrode PG exist. Namely, the potential adjusting electrodes EL are arranged opposite to each other with the photogate electrode PG (charge generating region) in between in the direction in which the first and second short sides SS1, SS2 are opposed.

The potential adjusting electrodes EL are rectangular on the plan view. In the present embodiment, the potential adjusting electrodes EL have a rectangular shape the long-side direction of which is the direction in which the first and second long sides LSI, LS2 of the photogate electrode PG are opposed. A ratio of the length of the first and second short sides of the potential adjusting electrodes EL to the length of the first and second long sides SS1, SS2 thereof is set, for example, to about 1:2 to 1:15. The potential adjusting electrodes EL are comprised of polysilicon, but these may be comprised of another material.

Figure 13:
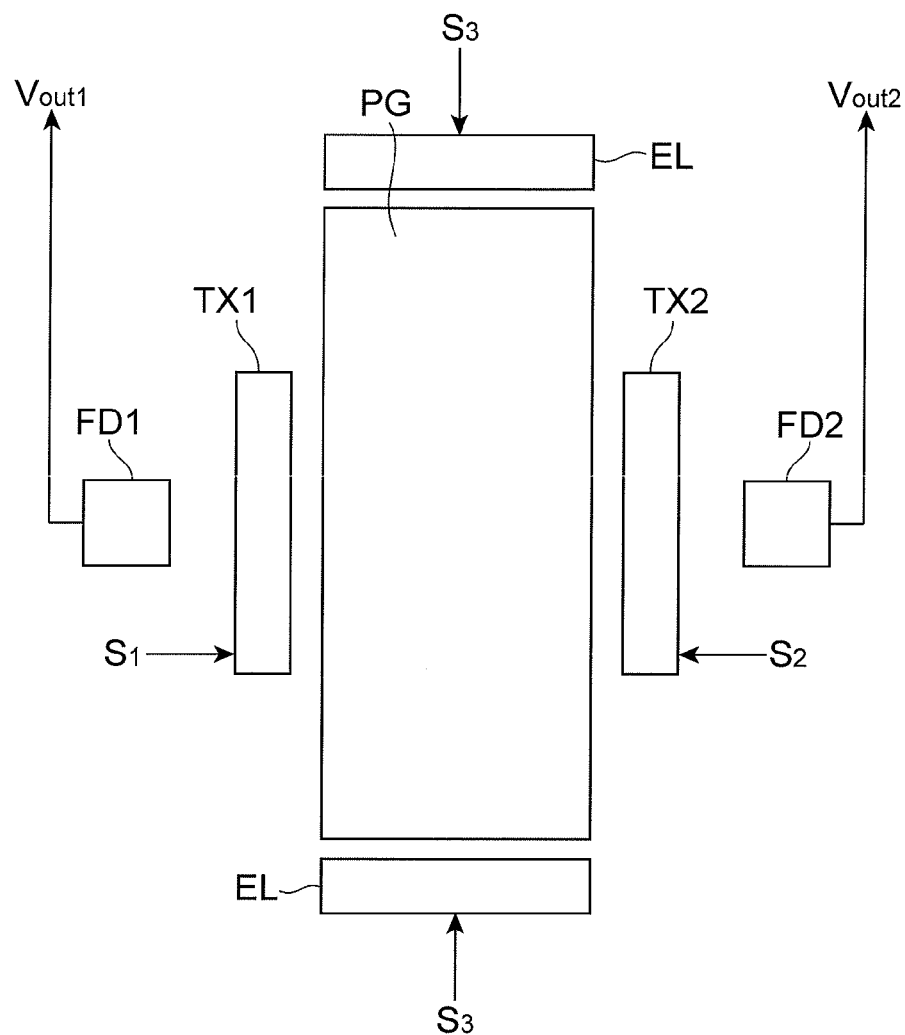
FIG. 13 is a schematic drawing for explaining a configuration of a pixel.
Figure 14:
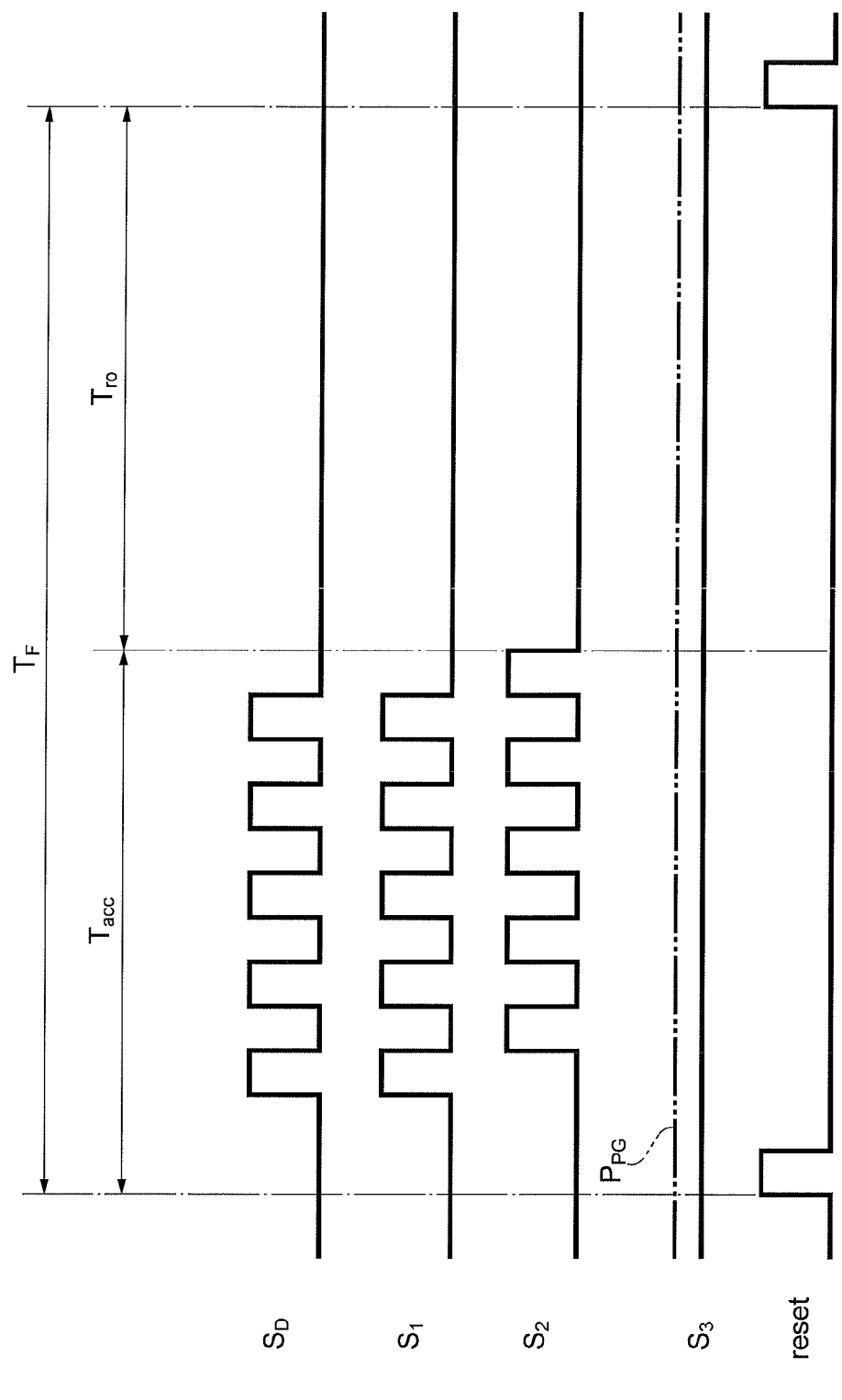
FIG. 14 is a timing chart of various signals.

The potential adjusting electrodes EL are given an electrical potential lower than the electrical potential ($P_{PG}$) given to the photogate electrode PG (intermediate electrical potential between the higher and the lower electrical potentials given to the first and second gate electrodes TX1, TX2), by a potential adjustment signal $S_3$, as shown in FIGS. 13 and 14. FIG. 13 is a schematic drawing for explaining a configuration of a pixel. FIG. 14 is a timing chart of actual various signals, in which the signals other than the potential adjustment signal $S_3$ are the same as the signals shown in FIG. 10. The potential adjustment signal $S_3$ is supplied from the controlling circuit 2.

Figure 15:
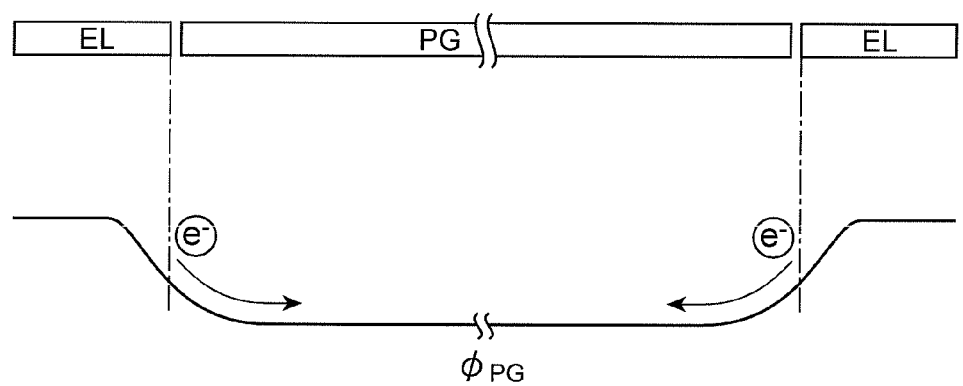
FIG. 15 is a drawing showing a potential profile, for explaining an accumulation operation of signal charge.

Since in the present modification example the potential adjusting electrodes EL are given the electrical potential lower than the electrical potential given to the photogate electrode PG, the potential $\Phi_{PG}$ of the region immediately below the photogate electrode PG is raised on the sides where the first and second short sides SS1, SS2 exist, as shown in FIG. 15. Therefore, a potential gradient decreasing from the sides of the first and second short sides SS1, SS2 toward the region located between the first and second semiconductor regions FD1, FD2 is formed in the region immediately below the photogate electrode PG.

The charge generated near the first and second short sides SS1, SS2 in the region immediately below the photogate electrode PG is accelerated according to the potential gradient formed by the potential adjusting electrodes EL, to quickly migrate toward the region located between the first and second semiconductor regions FD1, FD2. Then, as in the above embodiment, the migrating charge is accumulated in the potential well of the first semiconductor region FD1 or in the potential well of the second semiconductor region FD2 in accordance with the potential gradient formed by the electric field of the first gate electrode TX1 and the first semiconductor region FD1 or in accordance with the potential gradient formed by the electric field of the second gate electrode TX2 and the second semiconductor region FD2.

In the present modification example, as described above, the charge generated in the region immediately below the photogate electrode PG can also be quickly transferred, even in the case where the area is increased by setting the planar shape of the photogate electrode PG (charge generating region) to the rectangular shape and in the case where the enhancement of sensitivity is achieved by setting the area of the first and second semiconductor regions FD1, FD2 extremely small, as in the case of the above embodiment.

In the present modification example, the potential adjusting electrodes EL make the potential on the sides of the first and second short sides SS1, SS2 in the region immediately below the photogate electrode PG higher than the potential in the region located between the first and second semiconductor regions FD1, FD2. For this reason, the present modification example can readily realize the configuration for making the potential on the sides of the first and second short sides SS1, SS2 in the region immediately below the photogate electrode PG higher than the potential in the region located between the first and second semiconductor regions FD1, FD2.

The above described the preferred embodiments of the present invention, but it should be noted that the present invention is by no means limited to the above embodiments but can be modified in various ways without departing from the scope and spirit thereof.

The charge generating region where charge is generated according to incident light may be composed of a photodiode (e.g., a buried photodiode or the like). The range image sensor 1 may be a back illuminated type range image sensor. The range image sensor 1 does not have to be limited to those wherein pixels P(m, n) are arrayed in a two-dimensional pattern, but may be one wherein pixels P(m, n) are arrayed in a one-dimensional pattern.

Each of the numbers of the first and second semiconductor regions FD1, FD2 may be two or more. Namely, the first and second semiconductor regions FD1, FD2 may be two or more pairs thereof. Each of the numbers of the first and second gate electrodes TX1, TX2 may be two or more, corresponding to the number of the first and second semiconductor regions FD1, FD2.

The lengths of the third semiconductor regions SR1 and the potential adjusting electrodes EL in the direction in which the first and second long sides LS1, LS2 are opposed, are not limited to the aforementioned values. They may be set, for example, shorter than the length of the second short sides SS1, SS2 as long as the potential on the sides of the first and second short sides SS1, SS2 in the region immediately below the photogate electrode PG can be made higher than the potential in the region located between the first and second semiconductor regions FD1, FD2.

Industrial Applicability

The present invention is applicable to the range sensors and the range image sensors mounted on product monitors in manufacture lines in factories, on vehicles, and so on.

List of Reference Signs 1 range image sensor; 1A semiconductor substrate; 1Aa first region; 1Ab second region; EL potential adjusting electrodes; FD1 first semiconductor region; FD2 second semiconductor region; LS1 first long side; LS2 second long side; P pixel; PG photogate electrode; SR1 third semiconductor regions; SS1 first short side; SS2 second short side; TX1 first gate electrode; TX2 second gate electrode.

The invention claimed is:

1. A range sensor comprising:
a charge generating region which generates charge according to incident light and a planar shape of which is a rectangular shape having first and second long sides opposed to each other and first and second short sides opposed to each other;
at least a pair of signal charge collecting regions which are arranged opposite to each other with the charge generating region in between in a direction in which the first and second long sides are opposed, and which collect signal charge from the charge generating region;
transfer electrodes each of which is arranged between the signal charge collecting region and the charge generating region and to which respective charge transfer signals of different phases are supplied; and
potential adjusting means which are arranged opposite to each other with the charge generating region in between in a direction in which the first and second short sides are opposed, and which make a potential on the sides where the first and second short sides of the charge generating region exist, higher than a potential in a region located between at least the pair of signal charge collecting regions in the charge generating region,
wherein the potential adjusting means are semiconductor regions having the same conductivity type as the charge generating region and a higher impurity concentration than the charge generating region.

2. A range image sensor comprising an imaging region consisting of a plurality of units arranged in a one-dimensional or two-dimensional pattern, on a semiconductor substrate, and configured to obtain a range image, based on charge quantities output from the units,
wherein one said unit is the range sensor defined in claim 1.

* * * * *